(12) United States Patent
Ma

(10) Patent No.: US 9,123,813 B2
(45) Date of Patent: Sep. 1, 2015

(54) THIN FILM TRANSISTOR, ARRAY SUBSTRATE AND DISPLAY DEVICE

(71) Applicants: BOE Technology Group Co., Ltd., Beijing (CN); Beijing BOE Display Technology Co., Ltd., Beijing (CN)

(72) Inventor: Yu Ma, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 101 days.

(21) Appl. No.: 13/982,122

(22) PCT Filed: Feb. 27, 2013

(86) PCT No.: PCT/CN2013/071935
§ 371 (c)(1),
(2) Date: Jul. 26, 2013

(87) PCT Pub. No.: WO2013/143370
PCT Pub. Date: Oct. 3, 2013

(65) Prior Publication Data
US 2014/0077298 A1    Mar. 20, 2014

(30) Foreign Application Priority Data

Mar. 27, 2012    (CN) .......................... 2012 2 0120967

(51) Int. Cl.
*H01L 29/786*    (2006.01)
*H01L 27/12*    (2006.01)
(Continued)

(52) U.S. Cl.
CPC ............ *H01L 29/786* (2013.01); *G02F 1/1362* (2013.01); *G02F 1/136286* (2013.01); *H01L 27/1214* (2013.01); *H01L 29/42384* (2013.01); *H01L 29/78696* (2013.01)

(58) Field of Classification Search
CPC ...................................................... H01L 29/786
USPC ..................................................... 257/E51.005
See application file for complete search history.

(56) References Cited

U.S. PATENT DOCUMENTS 5,473,168 A     12/1995  Kawai et al.
6,639,281 B2 *  10/2003  Kane et al. ..................... 257/350

(Continued)

FOREIGN PATENT DOCUMENTS

CN    102034873 A    4/2011
CN    201845776 U    5/2011
CN    202487578 U    10/2012

OTHER PUBLICATIONS

International Preliminary Report on Patentability issued by the International Bureau of WIPO on Oct. 1, 2014, 8 pages.

(Continued)

*Primary Examiner* — Lex Malsawma

(57) ABSTRACT

A thin film transistor, an array substrate including the thin film transistor and a display device. The thin film transistor includes: a gate electrode (100), a gate insulating layer (200), an active layer (300) and a source/drain layer (400) that are successively stacked. The source/drain layer (400) comprises a source electrode (401) and a drain electrode (402) with a gap therebetween, and the active layer (300) forms a channel (301) in a region corresponding to the gap. The gate electrode (100) has a gate electrode protrusion (101) on at least one side of the channel (301) in its width direction; and the gate insulating layer (200) covers the gate electrode (100) and the gate electrode protrusion (101).

12 Claims, 3 Drawing Sheets

(51) Int. Cl.
    *G02F 1/1362*     (2006.01)
    *H01L 29/423*     (2006.01)

(56) References Cited

U.S. PATENT DOCUMENTS

2011/0073860 A1    3/2011    Kanno et al.
2014/0077298 A1    3/2014    Ma

OTHER PUBLICATIONS

International Search Report (Chinese language) issued by the State Intellectual Property Office ("SIPO") on Jun. 6, 2013 for PCT/CN2013/071935, 13 pages.
English abstract of CN 102034873A, listed above, 2 pages.
English abstract of CN 201845776U, listed above, 1 page.
English abstract of CN 202487578U, listed above, 2 pages.

\* cited by examiner

THIN FILM TRANSISTOR, ARRAY SUBSTRATE AND DISPLAY DEVICE

CROSS REFERENCE TO RELATED APPLICATIONS

This application is based on International Application No. PCT/CN2013/071935 filed on Feb. 27, 2013, which claims priority to Chinese National Application No. 201220120967.X, filed on Mar. 27, 2012, the contents of which are incorporated herein by reference.

FIELD OF THE INVENTION

The present disclosure relates to a thin film transistor, an array substrate and a display device.

BACKGROUND

As illustrated in FIGS. 1 and 2, a prior art thin film transistor TFT includes a gate electrode 100, a gate insulating layer 200, an active layer 300 and a source/drain layer 400 successively stacked from top to bottom on a substrate. A channel is formed between the source electrode and the drain electrode. The gate electrode 100 of TFT is connected with a gate line 500 on the array substrate, and the source electrode of TFT is connected with a data line 600 on the array substrate. As illustrated in FIG. 2, the gate electrode 100 of the prior art TFT is located at the bottom of the channel and influences the channel only from the bottom. Only one drain electrode current channel is formed after the TFT is turned on. Therefore, prior art TFTs have a low ON current Ion, a low opening ratio and high ON voltage and load.

SUMMARY

One object of the technical proposal according to the present disclosure is to raise the ON current of a thin film transistor.

One embodiment according to the present disclosure provides a thin film transistor including: a gate electrode, a gate insulating layer, an active layer and a source/drain layer that are successively stacked, wherein the source/drain layer comprises a source electrode and a drain electrode with a gap therebetween, and the active layer forms a channel in a region corresponding to the gap, the gate electrode has a gate electrode protrusion on at least one side of the channel in its width direction; and the gate insulating layer covers the gate electrode and the gate electrode protrusion.

In one example, in a direction along the channel's width, the gate electrode has a size greater than that of the active layer and the source/drain layer and protrudes beyond areas to which the active layer and the source/drain layer correspond on both sides of the channel.

In one example, the gate electrode protrusion is disposed on a part of the gate electrode that protrudes to both sides of the channel.

In one example, the gate electrode protrusion does not contact with the active layer and the source/drain layer and is separated from the active layer and the source/drain layer by the gate insulating layer.

In one example, the gate electrode protrusion protrudes in a stacking direction of the gate electrode, the gate insulating layer, the active layer and the source/drain layer.

In one example, the gate electrode has two gate electrode protrusions: a first gate electrode protrusion and a second gate electrode protrusion, the first gate electrode protrusion is located on one side of the channel, the second gate electrode protrusion is located on the other side of the channel, and either the first gate electrode protrusion or the second gate electrode protrusion does not contact with the active layer and the source/drain layer, the gate insulating layer covers the gate electrode and the two gate electrode protrusions.

In one example, the gate electrode protrusion has a length greater than or equal to that of the channel.

In one example, the gate electrode protrusion has a height greater than or equal to a sum of thicknesses of the gate insulating layer, the active layer and the source/drain layer.

In one example, the gate electrode protrusion faces the channel at least over an entire length of the channel.

Another embodiment according to the present disclosure provides an array substrate including a thin film transistor according to any one of the above-mentioned embodiments.

Yet another embodiment according to the present disclosure provides a display device including an array substrate according to the above embodiment.

In the thin film transistor TFT according to embodiments of the present disclosure, the gate insulating layer and the gate electrode extend to the channel direction to enwrap both sides (or one side) thereof in its width direction, which is equivalent to forming a plurality of current paths, thereby enhancing the ON current Ion of TFT.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiment 1

Figure 1:
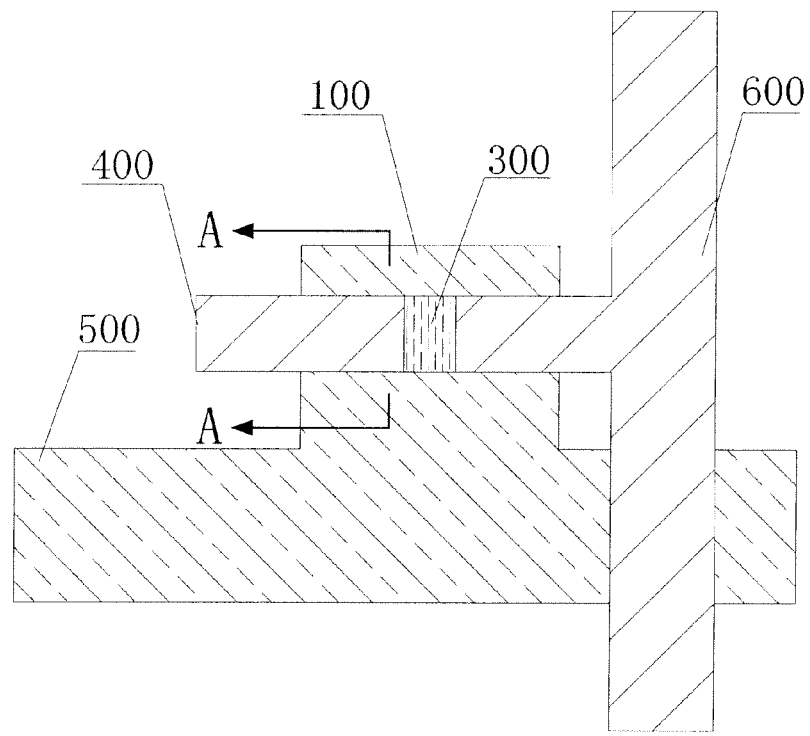
FIG. 1 is a structural representation of a prior art thin film transistor.
Figure 2:
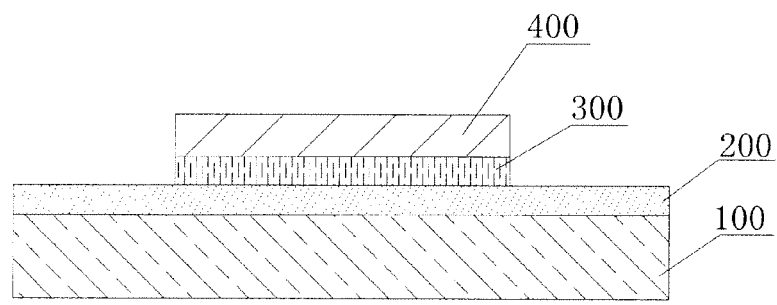
FIG. 2 is a sectional view along A-A direction in FIG. 1.
Figure 3:
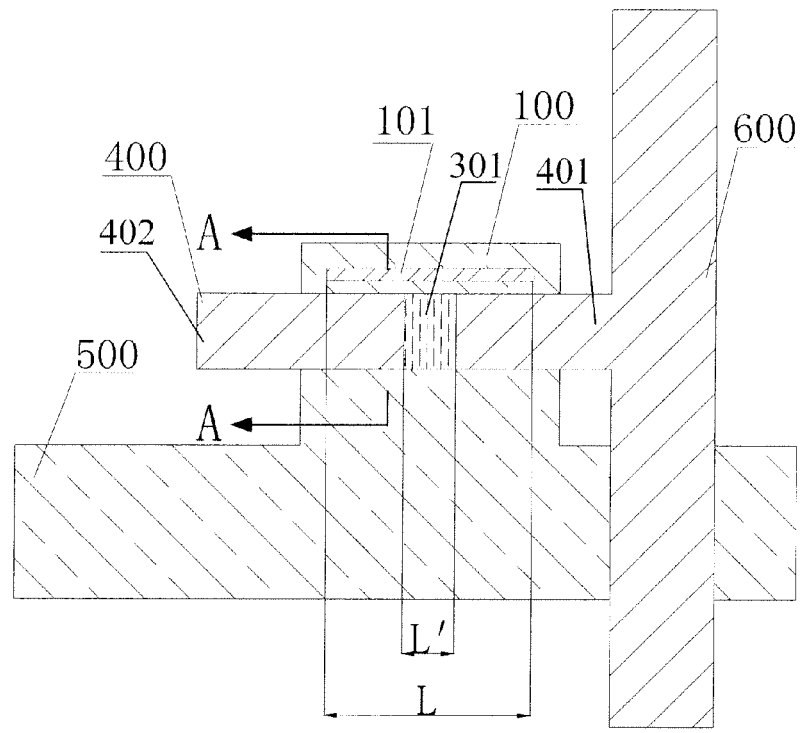
FIG. 3 is a structural representation of a thin film transistor according to embodiment 1 of the present disclosure.
Figure 4:
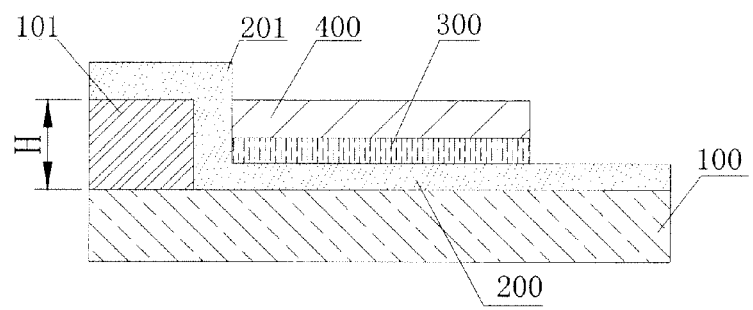
FIG. 4 is a sectional view along A-A direction in FIG. 3.

As illustrated in FIGS. 3 and 4, a thin film transistor according to the present embodiment includes: a gate electrode 100, a gate insulating layer 200, an active layer 300 and a source/drain layer 400 successively stacked from top to bottom on a substrate. The source/drain layer 400 includes a source electrode 401 and a drain electrode 402 with a gap therebetween. The active layer 300 forms a channel 301 in a region corresponding to the gap. In general, the dimension of channel in the direction from source electrode to drain electrode is referred to as the channel's length, the dimension of that in the direction perpendicular to the direction from source electrode to drain electrode is referred to as the channel's width. The gate electrode 100 of TFT is connected with a gate line 500 on the array substrate, and the source electrode 401 of TFT is connected with a data line 600 on the array substrate. The gate electrode 100 has an upward protruding gate electrode protrusion 101, that is, the gate electrode protrusion 101 protrudes from the gate electrode 100 in the stacking direction of the gate electrode 100, the gate insulating layer 200, the active layer 300 and the source/drain layer 400. The gate electrode protrusion 101 is located on one side of the channel in its width direction (A-A direction), and the gate electrode protrusion 101 does not contact with the active layer 300 and the source/drain layer 400. The gate insulating layer 200 covers the entire gate electrode 100 and the gate electrode protrusion 101, as illustrated in FIG. 4. Due to the presence of the gate electrode protrusion 101, the gate insulating layer 200 also forms an insulating protrusion 201 between the gate electrode protrusion 101 and the active layer 300 and the source/drain layer 400, isolating the gate electrode protrusion 101 and the active layer 300 and the source/drain layer 400 and covering the gate electrode protrusion 101.

The gate electrode 100 and the gate electrode protrusion 101 are manufactured in two steps of deposition, in which a gate electrode 100 is first manufactured and then a gate electrode protrusion 101 is manufactured on the gate electrode 100, both of which may be formed of the same or different metallic materials. After the gate electrode protrusion 101 is manufactured, the gate insulating layer 200, the active layer 300 and the source/drain layer 400 are manufactured.

As can be seen in FIG. 4, the gate electrode 100 enwraps the channel 301 from the bottom and one side of the channel 301 and influences the channel 301 from two directions, which is equivalent to forming two current paths, thereby enhancing ON current Ion of the TFT. For TFTs with the same size, TFTs of the present embodiment have greater Ion. However, the Ion required to turn on the panel is consistent, that is, TFTs of the present embodiment may be made smaller, thereby reducing capacitance on a part of panel. Given the same power consumption, the capacitance is lowered. The resistance of gate lines may be increased properly to maintain consistent power consumption, i.e., maintain the total capacitance and resistance attenuation consistent. The resistance is increased by reducing width of gate lines, and with narrower gate lines, the opening ratio is also increased. Furthermore, scaling down TFT itself may also increase the opening ratio for some configurations of pixel structure, such as transverse TFT or pixel structure of large size products. At the same time, with the scaling down of TFT, the capacitance between gate electrode and source electrode is also reduced. With a reduced capacitance, other corresponding circuit structures may also be modified properly, thereby enhancing the opening ratio. Since the TFT channel is surrounded in two directions, current carriers will have higher activity under the same voltage. The required ON voltage will be lower. Problems such as poor turning on under low temperature may be resolved.

In one example, as illustrated in FIG. 3, the length L of the gate electrode protrusion 101 is equal to or greater than the length L' of the channel 301. As illustrated in FIG. 4, the gate electrode protrusion 101 has a height H greater than or equal to the sum of thicknesses of the gate insulating layer 200, the active layer 300 and the source/drain layer 400 to completely surround one side of the channel 301 in the width direction, thereby further enhancing the ON current Ion of TFT.

Embodiment 2

Figure 5:
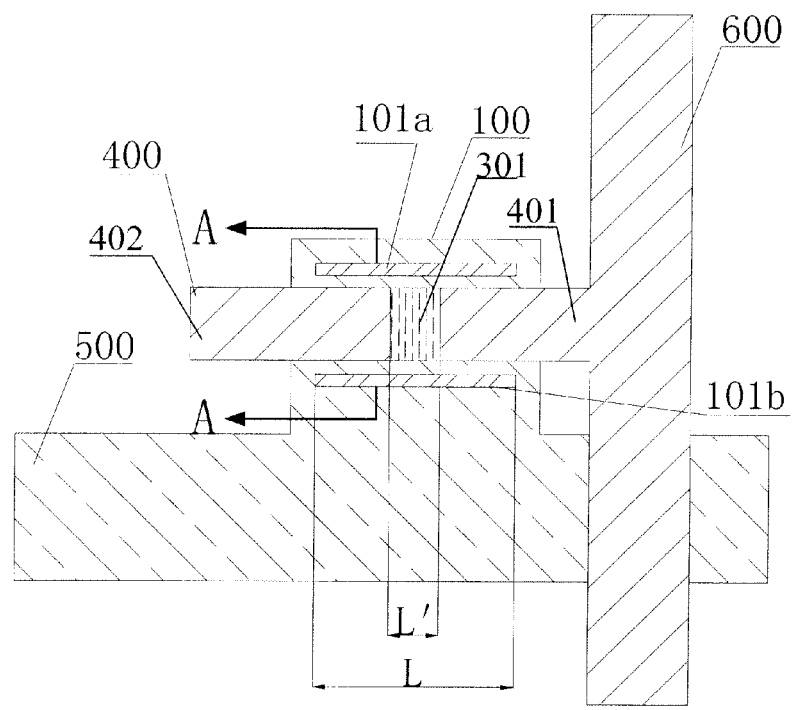
FIG. 5 is a structural representation of a thin film transistor according to embodiment 2 of the present disclosure.
Figure 6:
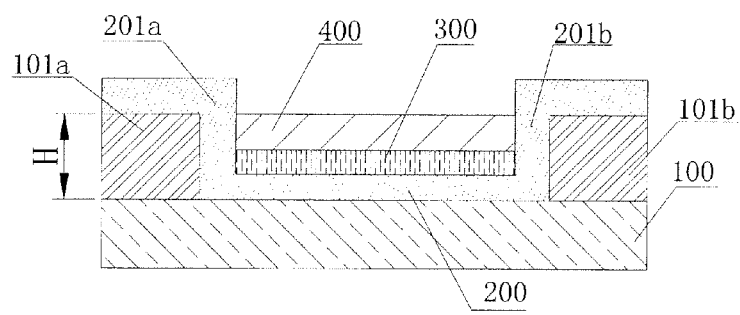
FIG. 6 is a sectional view along A-A direction in FIG. 5.

As illustrated in FIGS. 5 and 6, a thin film transistor according to the present embodiment includes: a gate electrode 100, a gate insulating layer 200, an active layer 300 and a source/drain layer 400 successively stacked from top to bottom on a substrate. The source/drain layer 400 includes a source electrode 401 and a drain electrode 402 with a gap therebetween. The active layer 300 forms a channel 301 in a region corresponding to the gap. In general, the dimension of channel in the direction from source electrode to drain electrode is referred to as the channel's length, the dimension of that in the direction perpendicular to the direction from source electrode to drain electrode is referred to as the channel's width. The gate electrode 100 of TFT is connected with a gate line 500 on the array substrate, and the source electrode 401 of TFT is connected with a data line 600 on the array substrate. The gate electrode 100 has two upward protruding gate electrode protrusions 101a and 101b. That is, the gate electrode protrusions 101a and 101b protrude from the gate electrode 100 in the stacking direction of the gate electrode 100, the gate insulating layer 200, the active layer 300 and the source/drain layer 400. The gate electrode protrusion 101a is located on one of the two sides of the channel 301 in its width direction, the gate electrode protrusion 101b is located on the other side of the channel 301, and either the gate electrode protrusions 101a or the gate electrode protrusion 101b does not contact with the active layer 300 and the source/drain layer 400. The gate insulating layer 200 covers the entire gate electrode 100 and the gate electrode protrusions 101a and 101b, as illustrated in FIG. 6. Due to the presence of the gate electrode protrusions 101a and 101b, the gate insulating layer 200 also forms two insulating protrusion 201a and 201b, in which the insulating protrusion 201a is between the gate electrode protrusion 101a and the active layer 300 and the source/drain layer 400 and covers the gate electrode protrusion 101a. The insulating protrusion 201b is between the gate electrode protrusion 101b and the active layer 300 and the source/drain layer 400 and covers the gate electrode protrusion 101b. The insulating protrusions 201a and 201b isolate the gate electrode protrusion 101a, 101b and the active layer 300 and the source/drain layer 400.

As can be seen in FIG. 6, the gate electrode 100, the gate electrode protrusion 101a and the gate electrode protrusion 101b surround the channel from three directions. That is, they enwrap the channel 301 from the bottom and two sides of the channel 301 and influence the channel from three directions, which is equivalent to forming three current paths, thereby enhancing ON current Ion of the TFT. For TFTs with the same size, TFTs of the present embodiment have greater Ion. The Ion required to turn on the panel is consistent, that is, in the present embodiment, the TFT may be made smaller. Compared with prior art TFTs, the TFT may be smaller, the breadth length ratio of TFT is lowered, the loads of TFT is reduced, which allows further reduction of gate line width, thereby enhancing the opening ratio. At the same time, with the scaling down of TFT, the capacitance between gate electrode and source electrode is also reduced. With a reduced capacitance, other corresponding circuit structures may also be modified properly, thereby enhancing the opening ratio. Since the TFT channel is surrounded in three directions, current carriers will have higher activity under the same voltage. The required ON voltage will be lower. Problems such as poor turning on under low temperature may be resolved.

In one example, As illustrated in FIG. 5, the length L of the gate electrode protrusions 101a and 101b is equal to or greater than the length L' of the channel. As illustrated in FIG. 6, the gate electrode protrusions 101a and 101b have a height H greater than or equal to the sum of thicknesses of the gate insulating layer 200, the active layer 300 and the source/drain layer 400 to completely surround the opening on one side of the channel, thereby further enhancing the ON current Ion of TFT.

Since the surrounding of channel in the present embodiment is from two side rather than two sides in embodiment 1, the effects of enhancing TFT's ON current Ion will be better than embodiment 1.

The above-mentioned embodiments 1 and 2 have been described with a bottom-gate TFT as an example. For a top-gate TFT with a gate electrode on top of it, the gate electrode protrusion extends downwards to surround the channel formed between the source electrode and the drain electrode or is located at one side on the openings on two sides of the channel, and the gate electrode protrusion has similar structure to that of embodiments 1 and 2, hence description thereof being omitted. That is, either in the bottom-gate structure or in the top-gate structure, the gate electrode protrusion may protrude in the stacking direction of the gate electrode, the gate insulating layer, the active layer and the source/drain layer to be opposed to the channel for applying electric field to the channel.

It is further noted that, in the above embodiments 1 and 2, in the direction along the channel 301's width, the gate electrode 100 has a size greater than that of the active layer 300 and the source/drain layer 400 and protrudes beyond the areas to which the active layer 300 and the source/drain layer 400 correspond on both sides of the channel 301. For example, the gate electrode protrusions 101, 101a and 101b are disposed on parts of the gate electrode 100 that protrude to two sides of the channel 301. Thus, the gate electrode protrusions 101, 101a and 101b may apply electric field to the channel on its sides.

In order to better apply electric field to the channel 301, the length of the gate electrode protrusions 101, 101a and 101b is preferably greater than or equal to that of the channel 301. In addition, the gate electrode protrusions 101, 101a and 101b are facing the channel 301 at least over the entire length of the channel 301.

Embodiment 3

The present embodiment further provides an array substrate including TFTs according to embodiment 1 or embodiment 2.

Embodiment 4

The present embodiment further provides a display device including the array substrate according to embodiment 3.

The foregoing are merely exemplary embodiments of the invention, but are not used to limit the protection scope of the invention. The protection scope of the invention shall be defined by the attached claims.

What is claimed is:

1. A thin film transistor comprising: a gate electrode, a gate insulating layer, an active layer and a source/drain layer successively stacked, wherein, the source/drain layer comprises a source electrode and a drain electrode with a gap therebetween, and the active layer forms a channel in a region corresponding to the gap, the gate electrode has a gate electrode protrusion on at least one side of the channel in its width direction; and the gate insulating layer covers the gate electrode and the gate electrode protrusion, wherein, the gate electrode protrusion protrudes in a stacking direction of the gate electrode, the gate insulating layer, the active layer and the source/drain layer from a surface of the gate electrode close to the gate insulating layer.

2. The thin film transistor according to claim 1, wherein, in a direction along the channel's width, the gate electrode has a size greater than that of the active layer and the source/drain layer and protrudes beyond areas to which the active layer and the source/drain layer correspond on both sides of the channel.

3. The thin film transistor according to claim 2, wherein, the gate electrode protrusion is disposed on a part of the gate electrode that protrudes to both sides of the channel.

4. The thin film transistor according to claim 3, wherein, the gate electrode protrusion protrudes in a stacking direction of the gate electrode, the gate insulating layer, the active layer and the source/drain layer.

5. The thin film transistor according to claim 1, wherein, the gate electrode protrusion does not contact with the active layer and the source/drain layer and is separated from the active layer and the source/drain layer by the gate insulating layer.

6. The thin film transistor according to claim 1, wherein, the gate electrode has two gate electrode protrusions: a first gate electrode protrusion and a second gate electrode protrusion, the first gate electrode protrusion is located on one side of the channel, the second gate electrode protrusion is located on the other side of the channel, and either the first gate electrode protrusion or the second gate electrode protrusion does not contact with the active layer and the source/drain layer, the gate insulating layer covers the gate electrode and the two gate electrode protrusions.

7. The thin film transistor according to claim 1, wherein, the gate electrode protrusion has a length greater than or equal to that of the channel.

8. The thin film transistor according to claim 1, wherein, the gate electrode protrusion has a height greater than or equal to a sum of thicknesses of the gate insulating layer, the active layer and the source/drain layer.

9. The thin film transistor according to claim 1, wherein, the gate electrode protrusion has a height greater than or equal to a sum of thicknesses of the gate insulating layer, the active layer and the source/drain layer.

10. The thin film transistor according to claim 1, wherein, the gate electrode protrusion faces the channel at least over an entire length of the channel.

11. An array substrate comprising a thin film transistor according to claim 1.

12. A display device comprising an array substrate according to claim 11.

* * * * *